United States Patent
Lin

(10) Patent No.: US 9,019,085 B2
(45) Date of Patent: Apr. 28, 2015

(54) ANTI-DISASSEMBLING DEVICE FOR ELECTRONIC PRODUCTS

(71) Applicant: National Cheng Kung University, Tainan (TW)

(72) Inventor: Chung-Hung Lin, Tainan (TW)

(73) Assignee: National Cheng Kung University, Tainan (TW)

( * ) Notice: Subject to any disclaimer, the term of this patent is extended or adjusted under 35 U.S.C. 154(b) by 280 days.

(21) Appl. No.: 13/775,437

(22) Filed: Feb. 25, 2013

(65) Prior Publication Data

US 2014/0145752 A1  May 29, 2014

(30) Foreign Application Priority Data

Nov. 28, 2012 (TW) .............................. 101144443 A

(51) Int. Cl.
*H03K 19/003* (2006.01)
*H02G 3/08* (2006.01)

(52) U.S. Cl.
CPC ................................. *H03K 19/003* (2013.01)

(58) Field of Classification Search
CPC ................................................. H03K 19/003
USPC ................. 340/12.55, 7.63, 7.52; 174/50, 64; 70/288

See application file for complete search history.

(56) References Cited

U.S. PATENT DOCUMENTS

| | | | | |
|---|---|---|---|---|
| 2,846,932 A | * | 8/1958 | Hooven et al. | ................. 396/553 |
| 3,448,247 A | * | 6/1969 | Jones, Jr. | ....................... 235/434 |
| 6,484,545 B1 | * | 11/2002 | Peter et al. | ....................... 70/288 |
| 6,838,616 B2 | * | 1/2005 | Harrison et al. | ................. 174/50 |

* cited by examiner

*Primary Examiner* — Nam V Nguyen
(74) *Attorney, Agent, or Firm* — Rosenberg, Klein & Lee

(57) ABSTRACT

An anti-disassembling device for an electronic product includes a case, a linear movement device, a circular movement device and an optical encoder. At least one retractable transmission member is connected to the case. The circular movement device is located in the case and has an encoding disk, which has multiple slots defined therethrough and teeth are defined in the periphery thereof. The at least one retractable transmission member is engaged with the teeth to rotate the encoding disk. The optical encoder has a lighting module which emits light beams through the slots of the encoding disk and a photosensitive module receives the light beams and sends a signal to the storage unit of the electronic product. The retractable device rotates when the electronic product is disassembled.

11 Claims, 5 Drawing Sheets

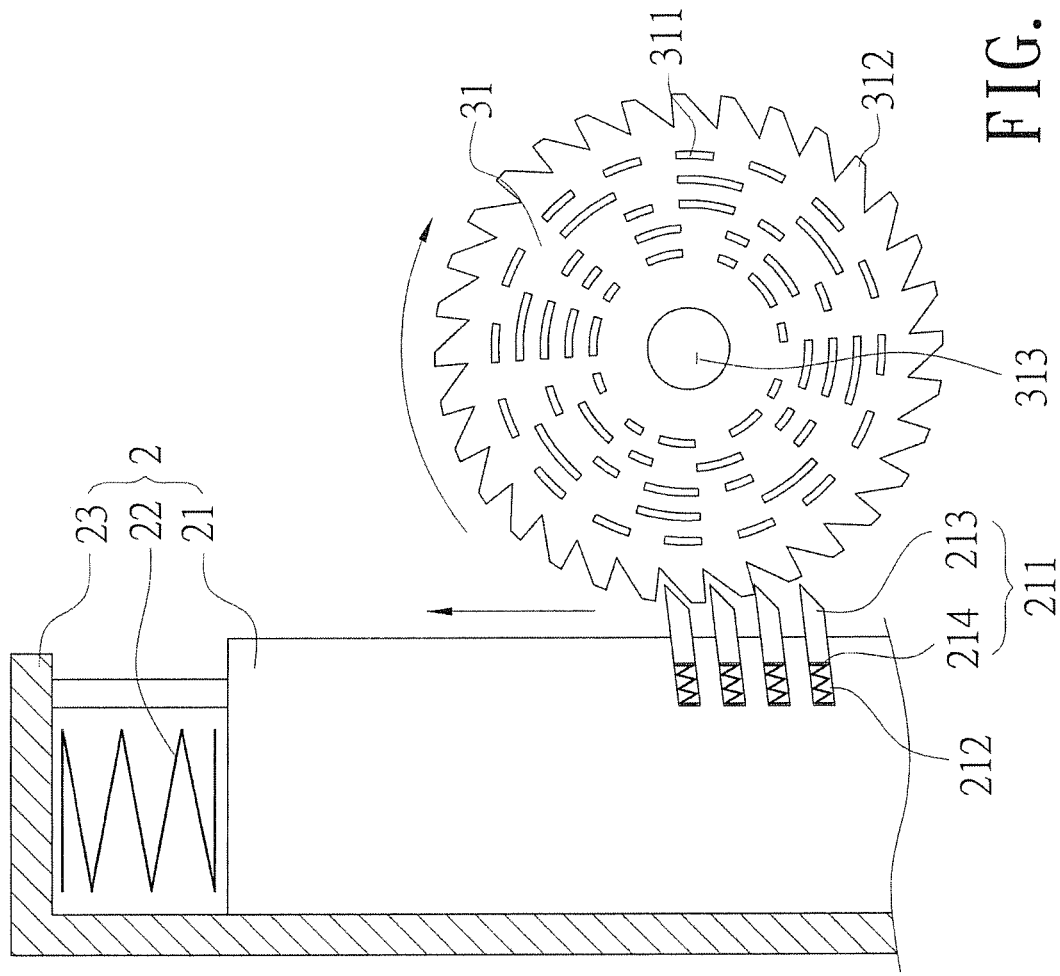

ANTI-DISASSEMBLING DEVICE FOR ELECTRONIC PRODUCTS

BACKGROUND OF THE INVENTION

1. Field of the Invention

The invention is a safety device that prevents the disassembling of electronic products from their supposed fixture.

2. Description of Related Art

The conventional assembly of an electronic product, e.g. a personal computer that has multiple parts and components such as power supply and hard disk, is accomplished by use of multiple screws and bolts. As most of consumer electronic products such as mobile phones, laptops, digital cameras, Globe Positioning Systems, and video game consoles provide product warranties, manufacturers and distributors have a genuine interest in ensuring that the assembly remains intact, or altered electronic products will compromise the proper management of product warranties, causing issues and raising disputes.

Currently, special bolts are used to prevent users of electronic products from disassembling and/or altering electronic products. However, these special bolts are visible to users and can easily be unscrewed by tools commonly available on the market. In other words, special bolts are incapable of ensuring the intactness of products, while other preventive measures so far available are expensive and complicated.

The invention is an anti-disassembling device for electronic products aiming to accomplish what bolts and screws cannot.

SUMMARY OF THE INVENTION

The invention is an anti-disassembling device for an electronic product which has a storage unit. The anti-disassembling device comprises of a case having a contact face. A linear movement device is connected to the contact face and has at least one retractable transmission member on a surface thereof. The linear movement device is merged into the case to stay in a compressed status when the contact face is fixed to an object. The linear movement device protrudes from the case in a free status when the contact face is separated from the object. A circular movement device is located in the case and has an encoding disk which has multiple slots arranged in a circle. The encoding disk has teeth defined in the periphery thereof and the at least one retractable transmission member is engaged with the teeth. The encoding disk is rotated when the linear movement device moves linearly and further co-moves the teeth. An optical encoder is located corresponding to the encoding disk and has a lighting module which emits light beams to the encoding disk. A photosensitive module receives the light beams through the encoding disk and has an output end which is connected with the electronic product. The output end of the photosensitive module sends a signal to the storage unit when the photosensitive module receives the light beams from the lighting module through the slot of the encoding disk. When the electronic product is disassembled, the programs of the electronic product cannot be opened and activated, so that the electronic product cannot function. Still, the circular movement device is rotated, so that the positions of the slots change and the output signal will differ from the original. The manufacturers will then acknowledge that the electronic product is disassembled or altered by the change of the signal.

Preferably, the linear movement device has a driving member on which the at least one retractable transmission member is located, a first resilient member connected to the first end of the driving member, and a contact member for receiving the driving member and the first resilient member therein. When the linear movement device stays in a compressed status, the first resilient member will contact against the contact member. The driving member has notches defined in a surface thereof and the at least one retractable transmission member is located in one of the notches. The at least one retractable transmission member has a rack and a second resilient member. The second resilient member is connected between the rack and the driving member. The contact member is a hollow tube and the driving member is a cylindrical member.

Preferably, the driving member has a flange on the second end thereof. The flange has a seal ring mounted thereto.

Preferably, the circular movement device has a support connected to the contact face and a shaft is connected to the support. The encoding disk has a hole at the center thereof and the shaft extends through the hole. The slots are located at different radii of the encoding disk. The number of the light beams from the lighting module is correspondent to different radii of the encoding disk. The shaft has a one-way bearing connected thereto and the encoding disk is mounted to the one-way bearing and rotates in one direction only.

Preferably, the lighting module has multiple light emitting diodes which are located corresponding to the slots of the encoding disk. The lighting module and the photosensitive module are respectively fixed to the contact face and located on two sides of the encoding disk.

Further details of the invention will be provided in the following description, with accompanying drawings which show, for purposes of illustration only, a preferred embodiment of the invention.

BRIEF DESCRIPTION OF THE DRAWINGS

FIG. 5 is a partial enlarged view to show the operation between the transmission members and the encoding disk of the invention.

DETAILED DESCRIPTION OF THE PREFERRED EMBODIMENT

Figure 1:
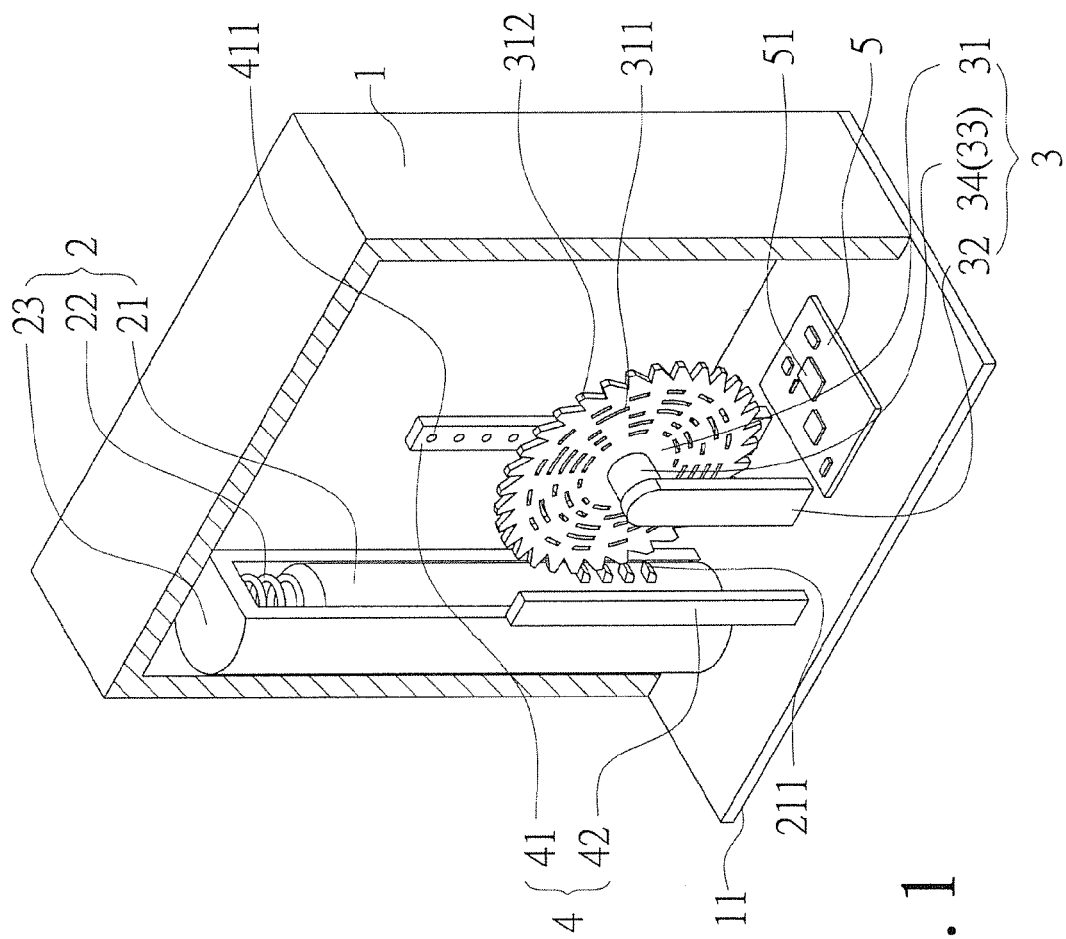
FIG. 1 is a perspective view to show the anti-disassembling device of the invention.

Referring to FIG. 1, the anti-disassembling device is suitable for being connected with an electronic product 5 which has a storage unit 51 for storage of the signals output from an optical encoder 4. The storage unit 51 can be a non-volatile memory or the like.

The anti-disassembling device of the invention comprises a case 1 having a contact face 11 to which an object, such as a computer case, a door or a vessel, is securely fixed.

A linear movement device 2 is connected to the contact face 11 and has at least one retractable transmission member 211 on a surface thereof. The linear movement device 2 is merged into the case 1 to stay in a compressed status when the contact face 11 is fixed on the object. The linear movement device 2 protrudes from the case 1 in a free status when the contact face 11 is separated from the object. In this embodiment, the linear movement device 2 has a driving member 21 on which the at least one retractable transmission member 211 is located. A first resilient member 22 is connected to the first end of the driving member 21. A contact member 23 accommodates the driving member 21 and the first resilient member 22 therein. When the linear movement device 2 stays in the compressed status, the first resilient member 22 is able to contact against the contact member 23. In this embodiment, the contact member 23 is a hollow tube, but different shapes are available, e.g. a hollow cylinder. As shown in FIG. 5, the driving member 21 has notches 212 defined in the surface thereof and the at least one retractable transmission member 211 is located in one of the notches 212. The at least one retractable transmission member 211 has a rack 213 and a second resilient member 214. The second resilient member 214 is connected between the rack 213 and the driving member 21. In this embodiment, the driving member 21 is a cylindrical member, although different shapes are available. The driving member 21 has a flange 215 on a second end thereof, and the flange 215 has a seal ring 216 mounted thereto so as to provide a water-proof feature to the case 1 as shown in FIG. 3.

A circular movement device 3 is located in the case 1 and has an encoding disk 31 which has multiple slots 311 arranged in a circle. The encoding disk 31 has teeth 312 defined in the periphery thereof and the at least one retractable transmission member 211 is engaged with the teeth 312. The encoding disk 31 will rotate when the linear movement device 2 moves linearly and further co-moves the teeth 312. In this embodiment, the circular movement device 3 has a support 32 connected to the contact face 11 and a shaft 33 connected to the support 32. The encoding disk 31 has a hole 313 at the center thereof and the shaft 33 extends through the hole 313. The slots 311 are located at different radii of the encoding disk 3. The number of the light beams from the lighting module 41 is correspondent to the different radii of the encoding disk 31. In this embodiment, multiple slots 311 in a circular arrangement are located at five different radii of the encoding disk 31. The shaft 33 has a one-way bearing 34 connected thereto and the encoding disk 31 is mounted to the one-way bearing 34 so that the encoding disk 31 rotates in one direction only.

Figure 2:
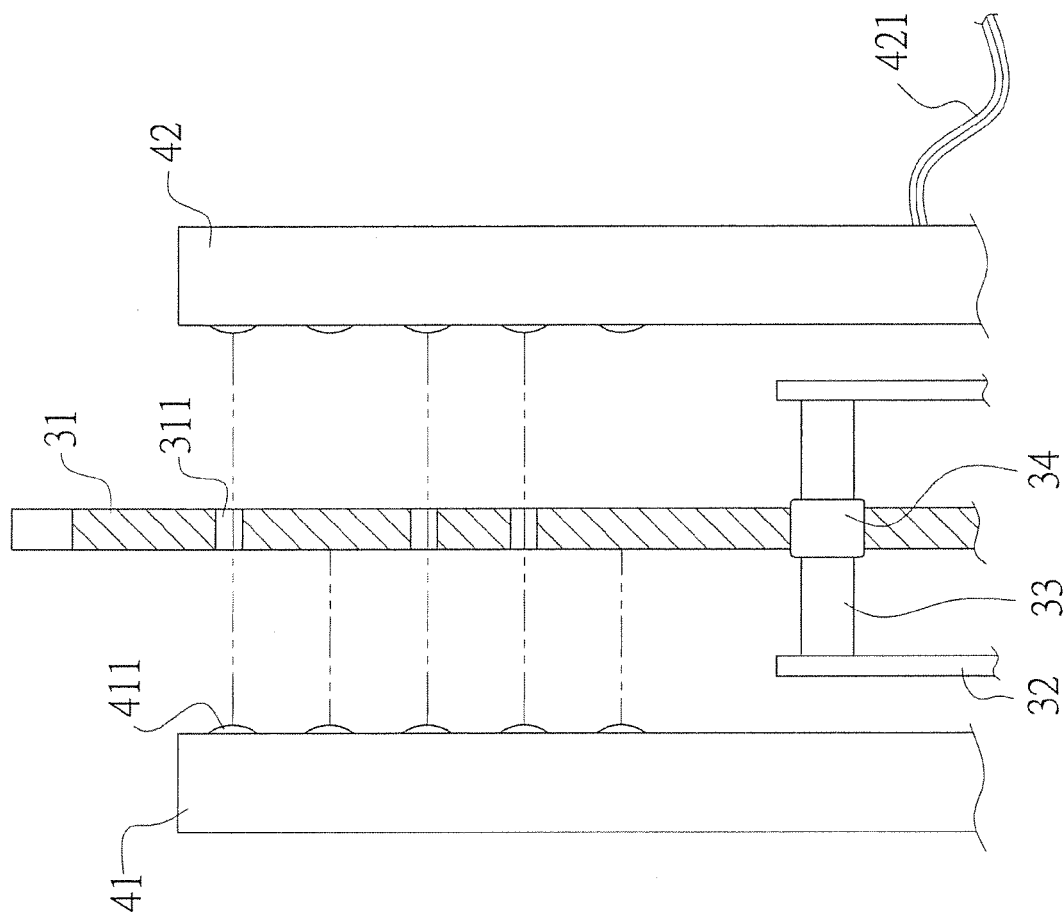
FIG. 2 is a cross sectional view to show the optical encoder of the anti-disassembling device of the invention.

The optical encoder 4 is located corresponding to the encoding disk 31 and has a lighting module 41 which emits light beams to the encoding disk 31. A photosensitive module 42 receives the light beams travelling through the encoding disk 31, and has an output end 421 which is connected with the electronic product 5. The output end 421 of the photosensitive module 42 sends a signal to the storage unit 51 when the photosensitive module 42 receives the light beams from the lighting module 41 through the slot 311 of the encoding disk 31. Further referring to FIG. 2, the lighting module 41 has multiple light emitting diodes 411 being located corresponding to the different radii of the encoding disk 31; in this specification, there are five light emitting diodes 411 corresponding to five different radii of the encoding disk 31. When the light beams travel through the slots 311, five sets of binary digit combinations are generated, e.g. 01001, which are the initial codes. The lighting module 41 and the photosensitive module 42 are respectively fixed to the contact face 11 and located on two sides of the encoding disk 31.

Figure 3:
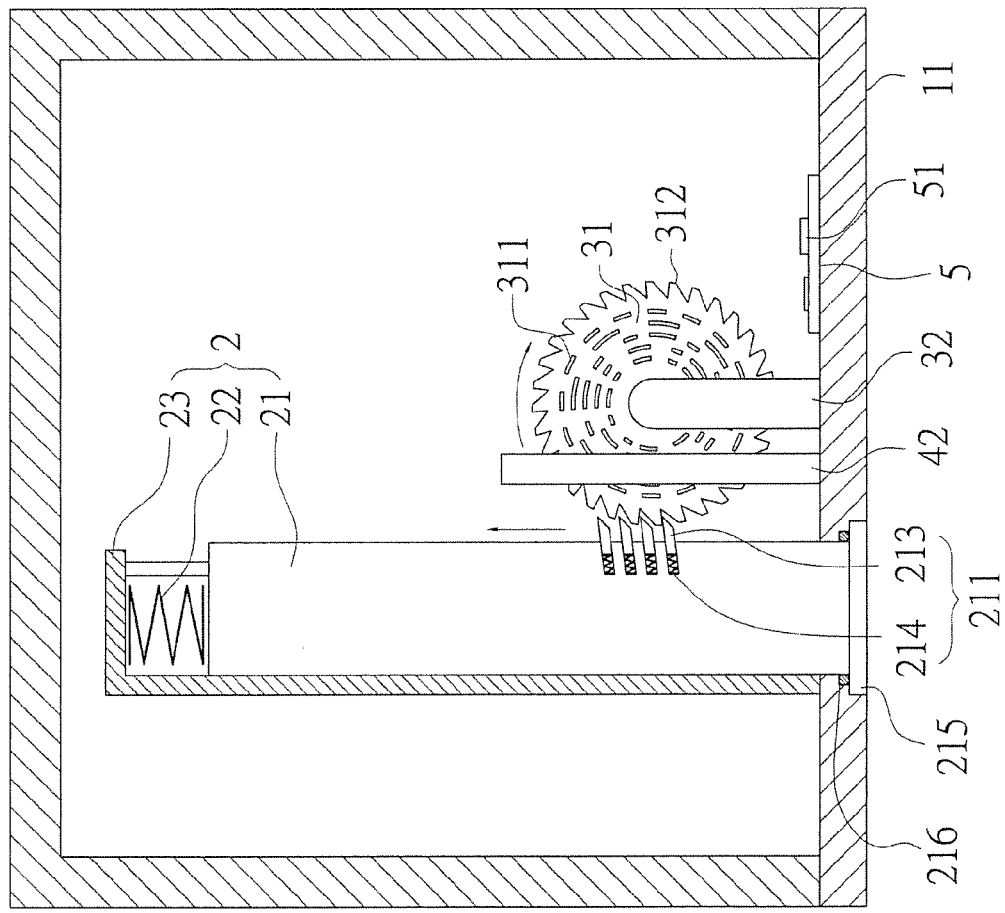
FIG. 3 is a cross sectional view to show that the anti-disassembling device of the invention is connected to an object.
Figure 4:
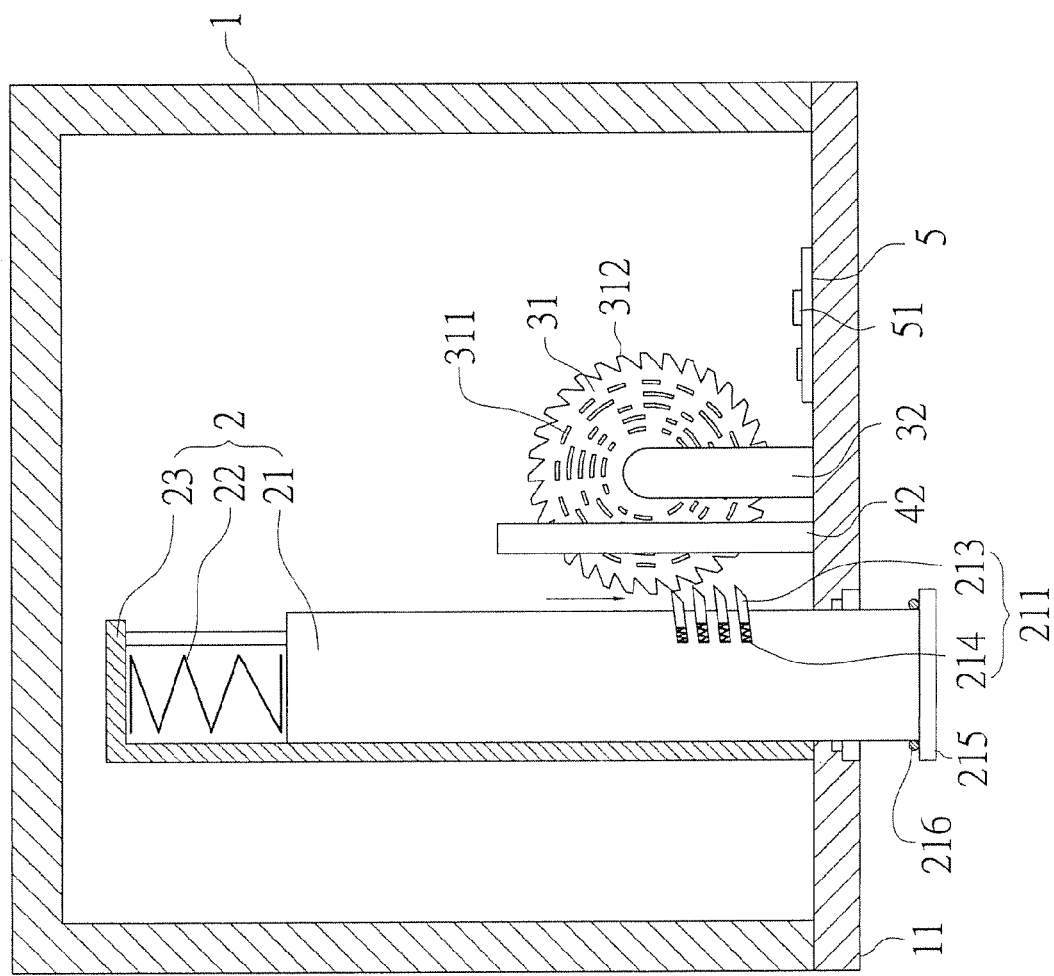
FIG. 4 is a cross sectional view to show that the anti-disassembling device of the invention is activated when the object is disassembled.

As referring to FIG. 3, it shows the anti-disassembling device being used on the electronic product 5 (i.e. a Globe Positioning System). There is nothing stored in the storage unit 51 (e.g. a non-volatile memory) of the electronic product 5 before the electronic product 5 leaves the factory as a new product and the anti-disasembling device isn't mounted on the electronic product 5. The driving member 21 is located at a low dead position because of the first resilient member 22, and the flange 215 of the driving member 21 protrudes from the case 1. When the anti-disassembling device is installed to a surface of a vessel, the driving member 21 gradually moves inward of the case 1 until the bottom surface of the flange 215 of the driving member 21 stays at the same level with the contact face 11 of the case 1, the driving member 21 is now located at a top dead position. At the top dead position, the first resilient member 22 contacts against the contact member 23 and the linear movement device 2 is in a compressed status. The outward-stretching force from the first resilient member 22 is applied to the driving member 21. Once the anti-disassembling device is removed or disassembled, the case 1 is removed from the surface of the vessel, the driving member 21 extends and becomes a free status as shown in FIG. 4. As shown in FIG. 5, during the inward movement of the driving member 21 into the case 1, the retractable rack 213 on the driving member 21 drives the encoding disk 31 to rotate clockwise as shown by the arrow head in FIG. 5, so that the positions of the slots 311 of the encoding disk 31 change. When the electronic product 5 is electrically activated, the light emitting diodes 411 generate light beams which travel through the slots 311 and reach the photosensitive module 42 on the other side of the encoding disk 31. The photosensitive module 42 is able to receive and transfer signals of various combinations of the light beams to corresponding pulse signals, which are set to be the initial code. It is noted that when more slots 311 are formed on the same radius of the encoding disk 31, and along with the increasing number of the slots 311, the angle that the encoding disk 31 rotates is more precisely calculated by the photosensitive module 42. Therefore, the degree of precision of the rotation of the encoding disk 31 can be increased by adding the number of the slots 311 of the encoding disk 31.

When the electronic product 5 is electrically activated, it detects the output from the photosensitive module 42 automatically and the output end 421 of the photosensitive module 42 stores the initial code to the storage unit 51 of the electronic product 5. Because the storage unit 51 is a non-volatile memory such as PROM, EPROM or flash memory etc., the initial code stored in the storage unit 51 would not disappear even if the power is cut off The initial code is re-accessed when the power is connected again. In other words, it can be known whether or not the electronic product 5 is disassembled or removed by checking the initial code. When the electronic product 5 is dissembled or removed, the driving member 21 is pushed by the first resilient member 22 to protrude externally, and the encoding disk 31 can only rotate in one direction because of the one-way bearing 34, so that the retractable rack 213 inwardly retracts by the force of the second resilient member 214 and the encoding disk 31 will stop rotate. In other words, during the protruding action of the driving member 21, the encoding disk 31 does not rotate, so the data stored in the storage unit 51 does not change. It is also noted that during the inward retracting action of the driving member 21, the encoding disk 31 rotates clockwise. Still, the counter-clockwise rotation of the encoding disk 31 is available in this invention, which also falls within the scope of the invention.

When the electronic product 5 is re-installed, the anti-disassembling device is installed to the surface as mentioned before to let the encoding disk 31 rotate clockwise. When the electronic product 5 is activated, the programs access the data of the output from the photosensitive module 42 and compare the data with the initial code, if the data is different from the initial code, it means that the electronic product 5 is disassembled, and the programs of the electronic product 5 cannot be opened and activated. Accordingly, the electronic product 5 cannot function. Besides, the output data by re-rotating the encoding disk 31 can be stored to the storage unit 51. Therefore, the times that the new data is stored in the storage unit 51 are the times that the electronic product 5 is disassembled. The anti-disassembling device can be installed to any kind of electronic products.

It can be detected whether or not an electronic product is disassembled by checking the initial code generated by the encoding disk 31 and the optical encoder 4. If the data is different from the initial code when the manufacturers examine the electronic product 5, this means that the electronic produce 5 has been disassembled, and the electronic product 5 cannot function properly.

The anti-disassembling device can be installed to any storage unit 51 of any electronic product 5 as long as the storage unit 51 is a non-volatile memory.

While we have shown and described the embodiment in accordance with the present invention, it should be clear to those skilled in the art that further embodiments may be made without departing from the scope of the present invention.

What is claimed is:

1. An anti-disassembling device for an electronic product which has a storage unit, comprising:
    a case having a contact face;
    a linear movement device connected to the contact face and having at least one retractable transmission member on a surface thereof, the linear movement device being merged into the case to stay in a compressed status when the contact face is fixed on an object, the linear movement device protruding from the case and being in a free status when the contact face is separated from the object;
    a circular movement device located in the case and having an encoding disk which has multiple slots in a circular arrangement on the encoding disk, the encoding disk having teeth defined in a periphery of the encoding disk and the at least one retractable transmission member engaged with the teeth, the encoding disk being rotated when the linear movement device moves linearly and co-moves the teeth, and
    an optical encoder located corresponding to the encoding disk and having a lighting module which emits light beams to the encoding disk, a photosensitive module receiving the light beams through the encoding disk and having an output end which is connected with the electronic product, the output end adapted to send a signal to the storage unit when the photosensitive module receives the light beams from the lighting module through the slot of the encoding disk.

2. The device as claimed in claim 1, wherein the linear movement device has a driving member on which the at least one retractable transmission member is located, a first resilient member being connected to a first end of the driving member, and a contact member for accommodating the driving member and the first resilient member; when the linear movement device is in the compressed status, the first resilient member contacts against the contact member.

3. The device as claimed in claim 2, wherein the contact member is a hollow tube.

4. The device as claimed in claim 2, wherein the driving member has notches defined in a surface thereof and the at least one retractable transmission member is located in one of the notches, the at least one retractable transmission member has a rack and a second resilient member, the second resilient member is connected between the rack and the driving member.

5. The device as claimed in claim 2, wherein the driving member has a flange on a second end thereof, and the flange has a seal ring.

6. The device as claimed in claim 5, wherein the driving member is a cylindrical member.

7. The device as claimed in claim 1, wherein the circular movement device has a support connected to the contact face and a shaft is connected to the support, the encoding disk has a hole defined at the center thereof and the shaft extends through the hole.

8. The device as claimed in claim 7, wherein the shaft has a one-way bearing for allowing the encoding disk to rotate in one direction only.

9. The device as claimed in claim 1, wherein the slots are located at different radii of the encoding disk, and a number of the light beams from the lighting module are correspondent to the different radii of the encoding disk.

10. The device as claimed in claim 9, wherein the lighting module has multiple light emitting diodes which are located corresponding to the different radii of the encoding disk, the lighting module and the photosensitive module are respectively fixed to the contact face and located on two sides of the encoding disk.

11. The device as claimed in claim 1, wherein the storage unit is a non-volatile memory.

* * * * *